(12) United States Patent
Raychaudhuri

(10) Patent No.: US 10,171,065 B2
(45) Date of Patent: Jan. 1, 2019

(54) PVT STABLE VOLTAGE REGULATOR

(71) Applicant: International Business Machines Corporation, Armonk, NY (US)

(72) Inventor: Arindam Raychaudhuri, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 33 days.

(21) Appl. No.: 15/433,033

(22) Filed: Feb. 15, 2017

(65) Prior Publication Data

US 2018/0234083 A1   Aug. 16, 2018

(51) Int. Cl.
| | |
|---|---|
| H03K 3/01 | (2006.01) |
| H03K 3/011 | (2006.01) |
| H02M 3/156 | (2006.01) |
| H02M 1/08 | (2006.01) |

(52) U.S. Cl.
CPC ............. H03K 3/011 (2013.01); H02M 1/08 (2013.01); H02M 3/156 (2013.01)

(58) Field of Classification Search
None
See application file for complete search history.

(56) References Cited

U.S. PATENT DOCUMENTS

| | | | |
|---|---|---|---|
| 5,773,967 A | 6/1998 | Tenten | |
| 6,690,147 B2 | 2/2004 | Bonto | |
| 6,710,583 B2 | 3/2004 | Stanescu et al. | |
| 6,933,772 B1 | 8/2005 | Banerjee et al. | |
| 6,952,091 B2 | 10/2005 | Bansal | |
| 7,323,853 B2 | 1/2008 | Tang et al. | |
| 7,479,820 B2 * | 1/2009 | Okamoto ............... | G11C 5/145 327/535 |
| 7,902,801 B2 | 3/2011 | Mandal | |
| 8,536,844 B1 | 9/2013 | Kumar et al. | |
| 9,715,245 B2 | 7/2017 | Yen et al. | |
| 2002/0118568 A1 * | 8/2002 | Tanzawa ............... | G11C 5/147 365/185.11 |
| 2008/0094045 A1 * | 4/2008 | Lin ........................ | G05F 1/56 323/274 |
| 2008/0157740 A1 | 7/2008 | Gurcan | |
| 2014/0277812 A1 | 9/2014 | Shih et al. | |
| 2016/0026204 A1 | 1/2016 | de Cremoux | |

(Continued)

OTHER PUBLICATIONS

Raychaudhuri, Arindam, "PVT Stable Voltage Regulator", U.S. Appl. No. 15/692,203, filed Aug. 31, 2017, 13 pages.

(Continued)

*Primary Examiner* — Long Nguyen
(74) *Attorney, Agent, or Firm* — Alexander G. Jochym

(57) ABSTRACT

An apparatus includes a voltage regulation module configured to provide an output voltage signal (Vout) and an auto-calibration module configured to provide a calibration current signal (Isink) corresponding to a voltage difference between a target voltage signal (Vtarget) and the output voltage signal (Vout). The voltage regulation module may adjust the output voltage in response to changes in the calibration current signal. In one embodiment, the voltage regulation module comprises an output voltage resistor pair of resistance R1 and R2, respectively, and the output voltage signal conforms to the equation Vout=Isink·R1+Vref·(1+R1/R2).

18 Claims, 3 Drawing Sheets

(56) References Cited

U.S. PATENT DOCUMENTS

2016/0065220 A1   3/2016  Rana et al.
2016/0161961 A1   6/2016  El-Nozahi et al.

OTHER PUBLICATIONS

IBM Appendix P, list of patents and patent applications treated as related, filed herewith, 2 pages.

Elshazly et al., "A 2GHz-to-7.5GHz Quadrature Clock-Generator Using Digital Delay Locked Loops for Multi-Standard I/Os in 14nm CMOS", 2014 Symposium on VLSI Circuits Digest of Technical Papers, © 2014 IEEE, 2 pages.

Tai et al., "A digital low drop-out regulator with wide operating range in a 16nm FinFET CMOS process", Solid-State Circuits Conference (A-SSCC), 2015 IEEE Asian, Date of Conference: Nov. 9-11, 2015, Date Added to IEEE Xplore: Jan. 21, 2016, Electronic ISBN: 978-1-4673-7191-9, INSPEC Accession No. 15728404, DOI: 10.1109/ASSCC.2015.7387481, Publisher: IEEE, 3 pages.

\* cited by examiner

PVT STABLE VOLTAGE REGULATOR

BACKGROUND OF THE INVENTION

The present invention relates generally to electronic circuits such as integrated circuits, and more particularly to voltage regulators in such circuits.

Voltage regulators, particularly low-dropout voltage regulators, typically use digital calibration engines to tune the regulators and account for process, voltage, and temperature (PVT) related variations in the regulated output voltage. Despite the foregoing, an extreme PVT condition may place a FET driver on the regulator output in a deep linear region of operation instead of the desired saturation region. Operating in a deep linear region results significant PVT sensitivity and poor voltage regulation.

SUMMARY

An apparatus includes a voltage regulation module configured to provide an output voltage signal (Vout) and an auto-calibration module configured to provide a calibration current signal (Isink) corresponding to a voltage difference between a target voltage signal (Vtarget) and the output voltage signal (Vout). The voltage regulation module may adjust the output voltage in response to changes in the calibration current signal. In one embodiment, the voltage regulation module comprises an output voltage resistor pair of resistance R1 and R2, respectively, and the output voltage signal conforms to the equation Vout=Isink·R1+Vref·(1+R1/R2).

DETAILED DESCRIPTION

At least some of the embodiments disclosed herein recognize that band-gap based voltage references are not available with many process technologies due to non-availability of bipolar devices. Also as supply voltages drop below 1 volt, FET-based reference circuits are used for biasing voltage regulators. Unfortunately, FET-based voltage references vary widely against process (P), voltage (V) and temperature (T) (collectively PVT) variations resulting in large variations in the output voltage of regulators—particularly low drop-out voltage regulators that are needed on integrated circuits.

To address this situation, digital calibration engines are used to adjust the relationship between the voltage reference input and the regulated output voltage. However, digital calibration engines consume significant chip area and power during calibration and typically can only be adjusted at system initialization. Furthermore, digital calibration complicates the start-up and initialization process of the chip and may fail to calibrate the regulated output at process, voltage, and temperature extremes.

It should be noted that references throughout this specification to features, advantages, or similar language herein do not imply that all of the features and advantages that may be realized with the embodiments disclosed herein should be, or are in, any single embodiment of the invention. Rather, language referring to the features and advantages is understood to mean that a specific feature, advantage, or characteristic described in connection with an embodiment is included in at least one embodiment of the present invention. Thus, discussion of the features, advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention. These features and advantages will become more fully apparent from the following drawings, description and appended claims, or may be learned by the practice of the invention as set forth hereinafter.

Figure 1:
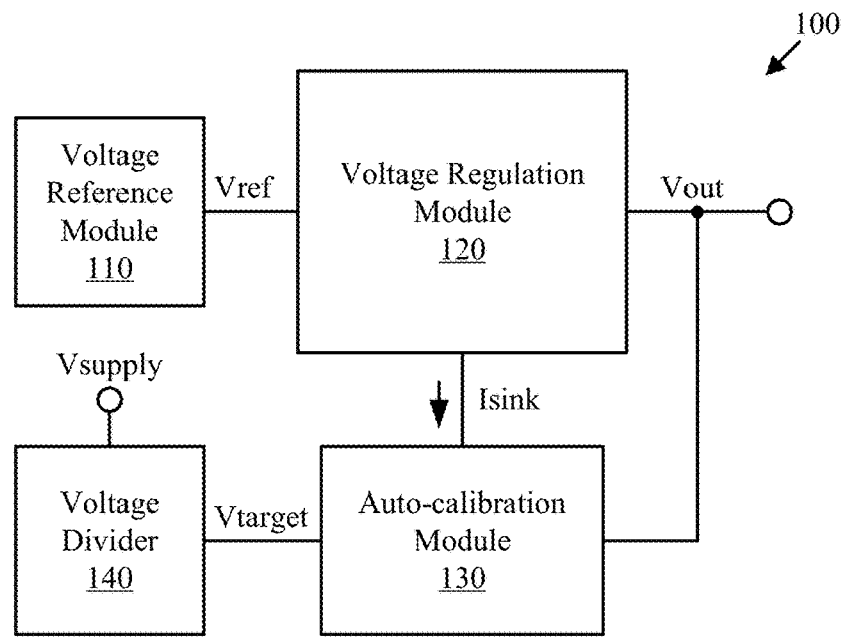
FIG. 1 is a block diagram depicting one example of a voltage regulation system in accordance with at least one embodiment of the present invention.

FIG. 1 is a block diagram depicting one example of a voltage regulation system 100 in accordance with at least one embodiment of the present invention. As depicted, the voltage regulation system 100 includes a voltage reference module 110, a voltage regulation module 120, an auto-calibration module 130, and a voltage divider 140. The voltage regulation system 100 provides stable voltage regulation despite varying PVT conditions. In some embodiments, the voltage regulation system 100 provides on-chip voltage regulation.

The voltage reference module 110 provides a voltage reference Vref to the voltage regulation module 120. The voltage reference Vref may be a FET-based reference that varies significantly under varying PVT conditions but provides a high power supply rejection ratio (PSRR). The voltage regulation module 120 receives the voltage reference Vref and a calibration current (Isink) and provides an output voltage Vout. In some embodiments, the voltage regulation module includes a voltage multiplier circuit that multiplies Vref by a selected ratio. In addition, the voltage regulation module may receive the calibration current Isink that calibrates the voltage regulation module and adjusts for PVT variations in the voltage reference Vref.

The auto-calibration module 130 receives the output voltage Vout and a target voltage Vtarget and provides the calibration current Isink. In the depicted embodiment, Isink corresponds to (e.g., is proportional to) a voltage difference between Vtarget and Vout. Vtarget may be a target voltage that is highly stable across PVT variations but has a low PSRR. In some embodiments, Vtarget is substantially equal to the desired voltage for Vout. In the depicted embodiment, Vtarget is provided by a voltage divider 140 that is driven by a supply voltage Vsupply resulting in high PVT stability but a low PSRR.

Figure 2:
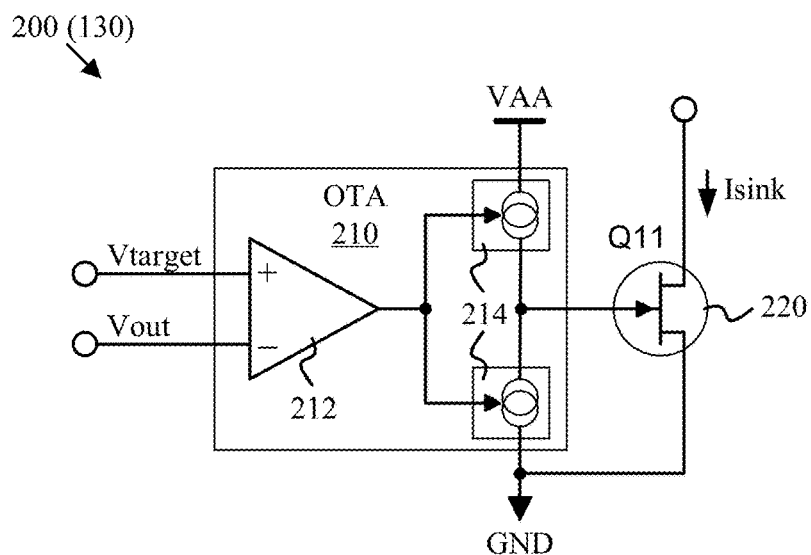
FIG. 2 is schematic diagram of one example of an auto-calibration module in accordance with at least one embodiment of the present invention.

FIG. 2 is schematic diagram of one example of an auto-calibration module 200 in accordance with at least one embodiment of the present invention. As depicted, the auto-calibration module 200 includes an amplifier 210 that drives a pull-down transistor 220. The auto-calibration module 200 provides a calibration current Isink that corresponds to a difference between the output voltage Vout and the target voltage Vtarget. In the depicted embodiment, the amplifier 210 is an operational transconductance amplifier that includes an op amp 212 and a pair of voltage controlled current sources 214. The auto-calibration module 200 is one example of the auto-calibration module 130 shown in FIG. 1.

Figure 3:
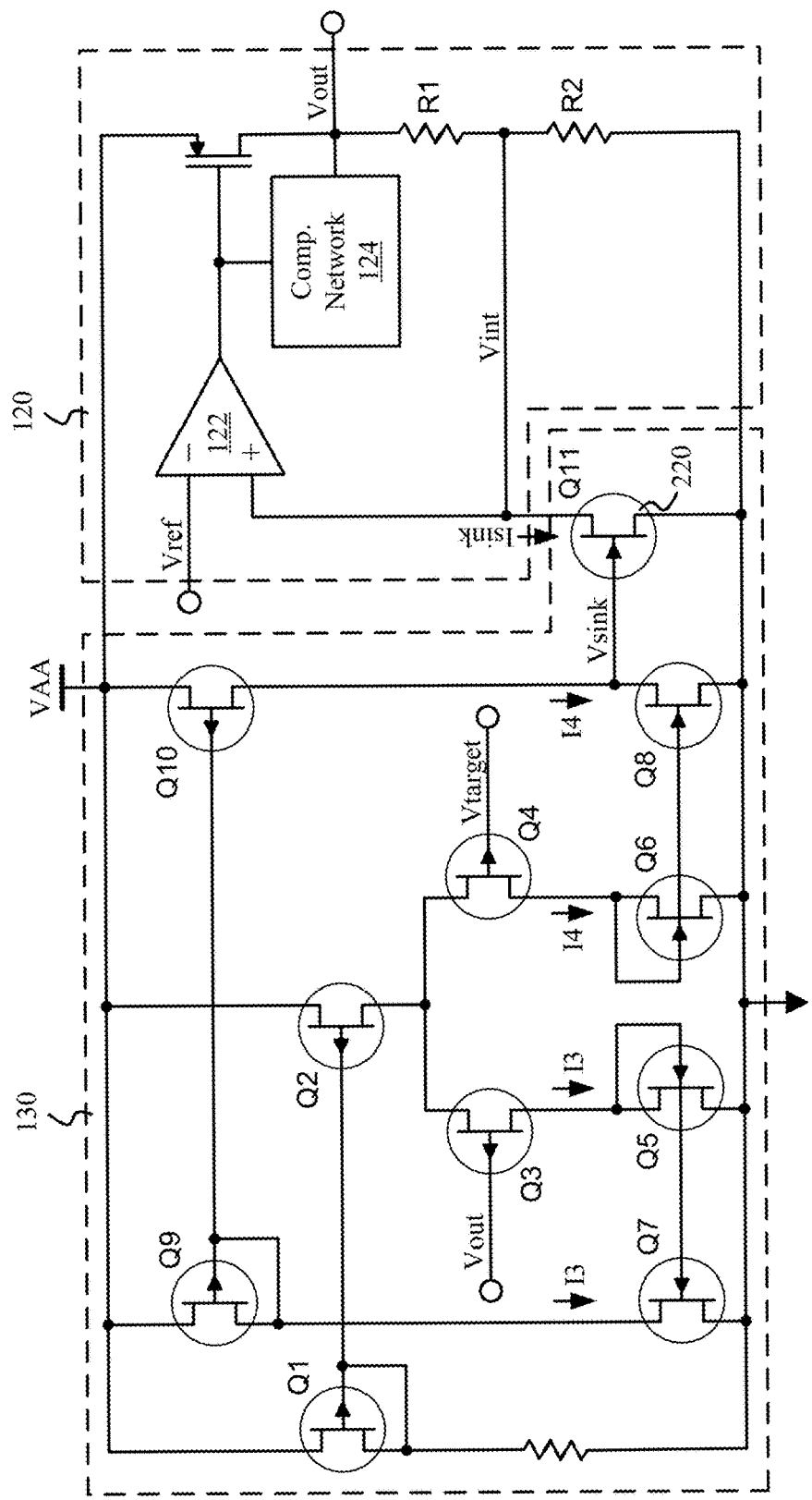
FIG. 3 is schematic diagram depicting one example of the voltage regulation module and the auto-calibration module of FIG. 1 in greater detail.

FIG. 3 is schematic diagram depicting one example of the voltage regulation module 120 and the auto-calibration module 130 of FIG. 1 in greater detail. As depicted, the auto-calibration module 130 includes a pair of differential input transistors (Q3, Q4) driven by Vout and Vtarget respectively, which produce differential currents I3 and I4 which are mirrored by the mirroring transistors Q5-Q8 resulting in a voltage Vsink that varies according to the voltage difference between Vout and Vtarget. The voltage Vsink drives the current sink transistor Q11 resulting in the calibration current Isink. The calibration current Isink provides an alternate current path for the current flowing through the output resistor R1 and effectively changes Vout by an amount equivalent to Isink*R1 as internal voltage signal Vint equalizes with Vref during regulation. Consequently, the gain provided by the voltage regulation module 120 and the resulting output voltage Vout can be adjusted by the auto-calibration module 130 via the calibration current Isink. In the depicted embodiment, the voltage regulation module 120 increases the output voltage in response to an increase in calibration current signal Isink and reduces the output voltage in response to a decrease in the calibration current signal Isink. In the depicted embodiment, the output voltage signal conforms to the equation Vout=Isink·R1+Vref·(1+R1/R2). The voltage regulation module 120 may also comprise a compensation network 124 that increases feedback stability. Consequently, the output voltage signal Vout provided by voltage regulation module may be highly insensitive to PVT variations while also achieving a high PSRR metric.

Figure 4:
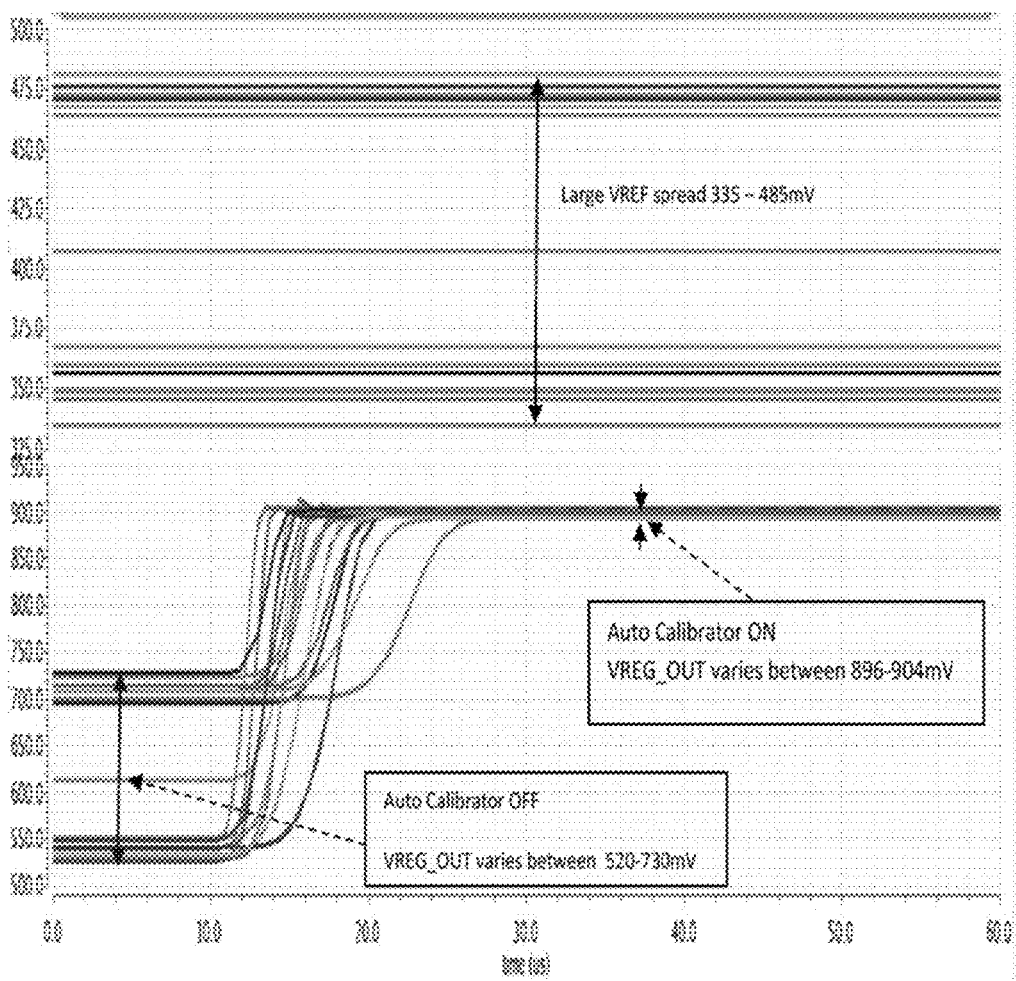
FIG. 4 is a graph that illustrates the effect of auto-calibration on regulation stability.

FIG. 4 is a graph that illustrates the effect of auto-calibration on regulation stability. Due to PVT variations, the reference voltage Vref may vary significantly resulting in variations in Vout. In the depicted example, the reference voltage Vref varies from 335 mV to 485 mV and Vout varies from 520 mV to 730 mV for a variation range of approximately 40 percent. However, by activating an auto-calibration module such as the auto-calibration module 200, Vout is stabilized despite PVT variations and only varies between 896 and 904 mV corresponding to a variation range of approximately 1 percent. The depicted results are for a c14 (14 nm) process technology.

One of skill in the art will appreciate that at least some of the embodiments disclosed herein eliminate the problem of wide fluctuation of regulator output as VREF changes with variations in PVT. Furthermore, such fluctuations are diminished without using a digital calibration engine. Additionally, auto-calibration works dynamically and automatically during chip operation and locks Vout to VTarget even if VREF changes with changing PVT conditions. Working dynamically and automatically during chip operation is a benefit that digitally calibrated voltage regulators are NOT able to achieve as the digital calibration algorithms run only during initialization and under RESET conditions. Furthermore, additional complex digital calibration algorithms and associated circuits and logic functionalities are not required resulting in simplified regulator operation and reduced power consumption.

It should be noted that this description is not intended to limit the invention. On the contrary, the embodiments presented are intended to cover some of the alternatives, modifications, and equivalents, which are included in the spirit and scope of the invention as defined by the appended claims. Further, in the detailed description of the disclosed embodiments, numerous specific details are set forth in order to provide a comprehensive understanding of the claimed invention. However, one skilled in the art would understand that various embodiments may be practiced without such specific details.

Although the features and elements of the embodiments disclosed herein are described in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

What is claimed is:

1. An apparatus comprising:
   a voltage regulation module configured to provide an output voltage signal (Vout);
   an auto-calibration module configured to provide a calibration current signal (Isink) corresponding to a voltage difference between a target voltage signal (Vtarget) and the output voltage signal (Vout), wherein the output voltage signal (Vout) is substantially equal to the target voltage signal (Vtarget); and
   the voltage regulation module configured to adjust the output voltage in response to changes in the calibration current signal.

2. The apparatus of claim 1, wherein the voltage regulation module is configured to increase the output voltage in response to an increase in the calibration current signal and reduce the output voltage in response to a decrease in the calibration current signal.

3. The apparatus of claim 1, wherein the auto-calibration module comprises an operational transconductance amplifier and a current sink transistor.

4. The apparatus of claim 1, wherein the voltage regulation module comprises a first resistor of resistance R1 and a second resistor of resistance R2 and the output voltage signal conforms to an equation Vout=Isink·R1+Vref·(1+R1/R2), wherein Vref is a voltage reference signal.

5. The apparatus of claim 1, further comprising a voltage reference module that provides a voltage reference signal (Vref) to the voltage regulation module.

6. The apparatus of claim 5, wherein the voltage reference signal (Vref) is provided by the voltage regulation module.

7. The apparatus of claim 1, wherein the target voltage signal (Vtarget) is derived from a power supply signal.

8. The apparatus of claim 7, wherein the target voltage signal is provided by a voltage divider driven by the power supply signal.

9. The apparatus of claim 1, wherein the voltage regulator is an on-chip regulator.

10. The apparatus of claim 1, wherein the voltage regulation module further comprises a compensation network configured to provide feedback stability.

11. A method comprising:
    generating an output voltage signal (Vout);

generating a calibration current signal (Isink) corresponding to a voltage difference between a target voltage signal (Vtarget) and the output voltage signal (Vout)), wherein the output voltage signal (Vout) is substantially equal to the target voltage signal (Vtarget); and adjusting the output voltage in response to changes in the calibration current signal.

12. The method of claim 11, wherein adjusting the output voltage comprises increasing the output voltage in response to an increase in the calibration current signal and reducing the output voltage in response to a decrease in the calibration current signal.

13. The method of claim 11, wherein the calibration current signal is generated by driving a current sink transistor with an operational transconductance amplifier.

14. The method of claim 11, wherein Vout is provided by a voltage regulation module comprising a first resistor of resistance R1 and a second resistor of resistance R2 and Vout conforms to the equation Vout=Isink·R1+Vref·(1+R1/R2) where Vref is a voltage reference signal.

15. The method of claim 14, further comprising providing Vref.

16. The method of claim 14, wherein Vref is provided by a voltage reference module.

17. The method of claim 11, wherein the target voltage signal (Vtarget) is derived from a power supply signal.

18. An apparatus comprising:

an integrated circuit;

a voltage regulation module integrated into the integrated circuit and configured to provide an output voltage signal (Vout);

an auto-calibration module integrated into the integrated circuit and configured to provide a calibration current signal (Isink) corresponding to a voltage difference between a target voltage signal (Vtarget) and the output voltage signal (Vout)), wherein the output voltage signal (Vout) is substantially equal to the target voltage signal (Vtarget); and the voltage regulation module configured to adjust the output voltage in response to changes in the calibration current signal.

* * * * *